United States Patent
Kawai et al.

(10) Patent No.: US 11,121,697 B2
(45) Date of Patent: Sep. 14, 2021

(54) QUARTZ CRYSTAL RESONATOR AND QUARTZ CRYSTAL RESONATOR UNIT

(71) Applicant: Murata Manufacturing Co., Ltd., Nagaokakyo (JP)

(72) Inventors: Ryuichi Kawai, Nagaokakyo (JP); Hiroyuki Yamamoto, Nagaokakyo (JP); Hiroaki Kaida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 833 days.

(21) Appl. No.: 15/856,414

(22) Filed: Dec. 28, 2017

(65) Prior Publication Data

US 2018/0123560 A1  May 3, 2018

Related U.S. Application Data

(63) Continuation of application No. PCT/JP2016/069935, filed on Jul. 5, 2016.

(30) Foreign Application Priority Data

Jul. 9, 2015  (JP) .............................. JP2015-137534

(51) Int. Cl.
*H03H 9/19* (2006.01)
*H03H 9/02* (2006.01)
(Continued)

(52) U.S. Cl.
CPC ................ *H03H 9/19* (2013.01); *H03H 3/02* (2013.01); *H03H 9/02023* (2013.01);
(Continued)

(58) Field of Classification Search
CPC .. H03H 9/15; H03H 9/17; H03H 9/19; H03H 9/172; H03H 9/02023; H03H 9/1021
(Continued)

(56) References Cited

U.S. PATENT DOCUMENTS 8,541,928 B2   9/2013 Shimao et al.
2009/0102322 A1*  4/2009 Akane ................. H03H 9/1021
                                                            310/348
(Continued)

FOREIGN PATENT DOCUMENTS

JP    2007-251918 A   9/2007
JP    2011-61418 A    3/2011
(Continued)

OTHER PUBLICATIONS

International Search Report issued in International Application No. PCT/JP2016/069935, dated Sep. 20, 2016.
(Continued)

*Primary Examiner* — Derek J Rosenau
(74) *Attorney, Agent, or Firm* — Arent Fox LLP

(57) ABSTRACT

A quartz crystal resonator that includes an AT-cut quartz crystal blank that is plate-shaped and that is rectangular when viewed in a direction normal to a main surface thereof; and a first outer electrode and a second outer electrode disposed on the main surface and arranged in a short-side direction of the main surface. Long sides of the main surface are substantially parallel to a Z' axis of the quartz crystal blank. The short sides of the main surface are substantially parallel to an X axis of the quartz crystal blank. A frequency of a main vibration of the quartz crystal blank is in a range of 20.0 MHz to 60.0 MHz, and $0.050 \leq P \leq -0.0047 \times F + 1.728$, where P (mm) is a distance between the first outer electrode and the second outer electrode in the short-side direction, and F (MHz) is the frequency of the main vibration.

16 Claims, 11 Drawing Sheets

(51) Int. Cl.
H03H 9/10 (2006.01)
H03H 9/05 (2006.01)
H03H 3/02 (2006.01)
H03H 9/13 (2006.01)

(52) U.S. Cl.
CPC ...... *H03H 9/02157* (2013.01); *H03H 9/0552* (2013.01); *H03H 9/10* (2013.01); *H03H 9/1021* (2013.01); *H03H 9/13* (2013.01)

(58) Field of Classification Search
USPC .................................................. 310/344, 348
See application file for complete search history.

(56) References Cited

U.S. PATENT DOCUMENTS

2012/0126668 A1* 5/2012 Ii ............................ H01L 41/08
310/357
2012/0242193 A1 9/2012 Shimao et al.

FOREIGN PATENT DOCUMENTS

JP 2013-21667 A 1/2013
JP 2014-179770 A 9/2014

OTHER PUBLICATIONS

Written Opinion of the International Searching Authority issued in International Application No. PCT/JP2016/069935, dated Sep. 20, 2016.

* cited by examiner

FIG. 1
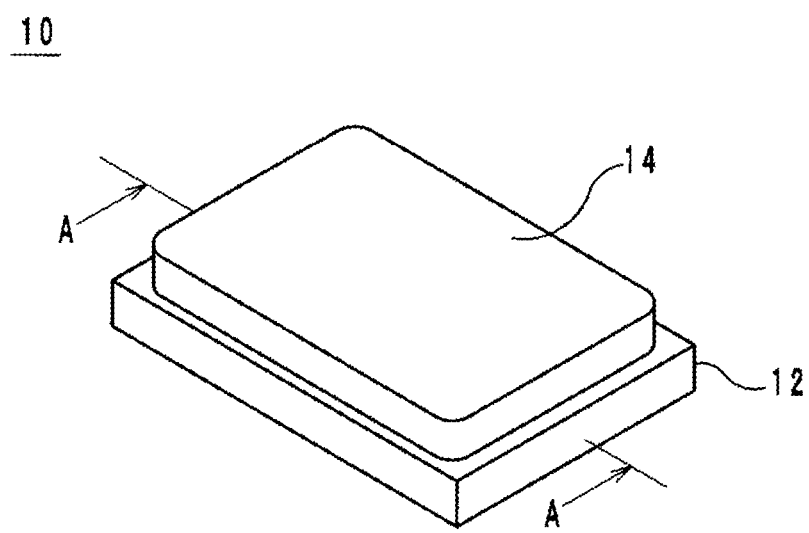
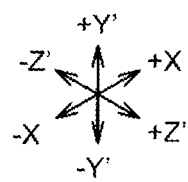

FIG. 5
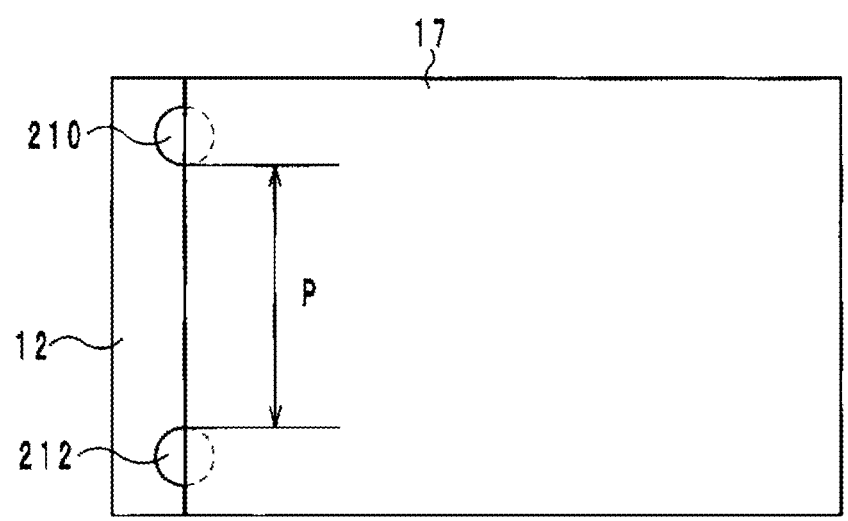
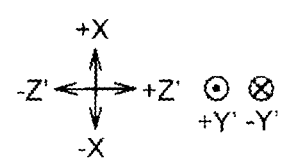

QUARTZ CRYSTAL RESONATOR AND QUARTZ CRYSTAL RESONATOR UNIT

CROSS REFERENCE TO RELATED APPLICATIONS

The present application is a continuation of International application No. PCT/JP2016/069935, filed Jul. 5, 2016, which claims priority to Japanese Patent Application No. 2015-137534, filed Jul. 9, 2015, the entire contents of each of which are incorporated herein by reference.

FIELD OF THE INVENTION

The present invention relates to an AT-cut quartz crystal resonator and a quartz crystal resonator unit.

BACKGROUND OF THE INVENTION

Examples of existing inventions related to a quartz crystal resonator unit include a quartz crystal resonator unit described in Patent Document 1. The quartz crystal resonator unit includes a quartz crystal resonator including a quartz crystal blank and two outer electrodes. The quartz crystal blank is a rectangular AT-cut quartz crystal blank. The long-side direction of the quartz crystal blank coincides with the Z' direction (the direction in which the quartz crystal blank is cut out). The two outer electrodes are arranged in the short-side direction of the quartz crystal blank. The two outer electrodes of the quartz crystal resonator are fixed to two outer electrodes of a ceramic substrate via electroconductive adhesives. Thus, the quartz crystal resonator is fixed to the ceramic substrate at positions near a short side of the quartz crystal resonator.

However, the quartz crystal resonator unit described in Patent Document 1 has a problem in that the crystal impedance value (hereinafter, referred to as the "CI value") of the quartz crystal resonator unit is large. To be specific, the coefficient of thermal expansion of the ceramic substrate, on which the quartz crystal blank is mounted, is about $7.0 \times 10^{-6}/°C$. The coefficient of thermal expansion of the quartz crystal blank in the X direction is about $13.0 \times 10^{-6}/°C$, and the coefficient of thermal expansion of the quartz crystal blank in the Z' direction is about $10.0 \times 10^{-6}/°C$. Accordingly, the difference between the coefficient of thermal expansion of the quartz crystal blank in the X direction and the coefficient of thermal expansion of the ceramic substrate is larger than the difference between the coefficient of thermal expansion of the quartz crystal blank in the Z' direction and the coefficient of thermal expansion of the ceramic substrate. Therefore, when the long-side direction of the quartz crystal blank coincides with the Z' direction and the short-side direction of the quartz crystal blank coincides with the X direction, there is a large difference between the coefficient of thermal expansion of the quartz crystal blank and the coefficient of thermal expansion of the ceramic substrate at a short side of the quartz crystal blank that is fixed. Thus, in a process of thermally curing the electroconductive adhesives when fixing the quartz crystal resonator to the ceramic substrate, a large difference occurs between the extension of the ceramic substrate and the extension of a part of the quartz crystal blank near the short side. As a result, a residual stress is generated in regions near the two outer electrodes after the quartz crystal resonator and the ceramic substrate have been cooled. The residual stress causes an increase in the CI value of the quartz crystal resonator unit.

Patent Document 1: Japanese Unexamined Patent Application Publication No. 2014-179770

SUMMARY OF THE INVENTION

An object of the present invention is to provide a quartz crystal resonator and a quartz crystal resonator unit that can reduce the CI value.

A quartz crystal resonator unit according to an aspect of the present invention includes a quartz crystal resonator including a quartz crystal blank, a first outer electrode, and a second outer electrode; and a substrate including a substrate body that is plate-shaped and a third outer electrode and a fourth outer electrode that are disposed on a main surface of the substrate body. The quartz crystal blank is an AT-cut quartz crystal blank that is plate-shaped and that is rectangular when viewed in a direction normal to a main surface thereof. The first outer electrode and the second outer electrode are disposed on the main surface and arranged in a short-side direction in which short sides of the main surface extend. Long sides of the main surface are substantially parallel to a Z' axis of the quartz crystal blank. The short sides of the main surface are substantially parallel to an X axis of the quartz crystal blank. A frequency of a main vibration of the quartz crystal blank is in a range of 20.0 MHz to 60.0 MHz. The first outer electrode and the third outer electrode are fixed to each other via a first electroconductive adhesive, and the second outer electrode and the fourth outer electrode are fixed to each other via a second electroconductive adhesive. In the quartz crystal resonator unit, $0.050 \leq P \leq -0.0047 \times F + 1.728$ is satisfied, where P (mm) is a minimum distance between a first portion where the first electroconductive adhesive is in contact with the quartz crystal resonator and a second portion where the second electroconductive adhesive is in contact with the quartz crystal resonator in the short-side direction, and F (MHz) is the frequency of the main vibration of the quartz crystal blank.

A quartz crystal resonator according to another aspect of the present invention includes an AT-cut quartz crystal blank that is plate-shaped and that is rectangular when viewed in a direction normal to a main surface thereof; and a first outer electrode and a second outer electrode disposed on the main surface and arranged in a short-side direction in which short sides of the main surface extend. Long sides of the main surface are substantially parallel to a Z' axis of the quartz crystal blank. The short sides of the main surface are substantially parallel to an X axis of the quartz crystal blank. A frequency of a main vibration of the quartz crystal blank is in a range of 20.0 MHz to 60.0 MHz. In the quartz crystal resonator, $0.050 \leq P \leq -0.0047 \times F + 1.728$ is satisfied, where P (mm) is a distance between the first outer electrode and the second outer electrode in the short-side direction, and F (MHz) is the frequency of the main vibration of the quartz crystal blank.

With the present invention, the CI value can be reduced.

BRIEF DESCRIPTION OF THE DRAWINGS

FIG. 1 is an external perspective view of a quartz crystal resonator unit 10.

FIG. 5 illustrates the model used in the computer simulation performed by the inventors, as seen from the +Y' side.

DETAILED DESCRIPTION OF THE PREFERRED EMBODIMENTS (Structure of Quartz Crystal Resonator Unit)

Figure 2:
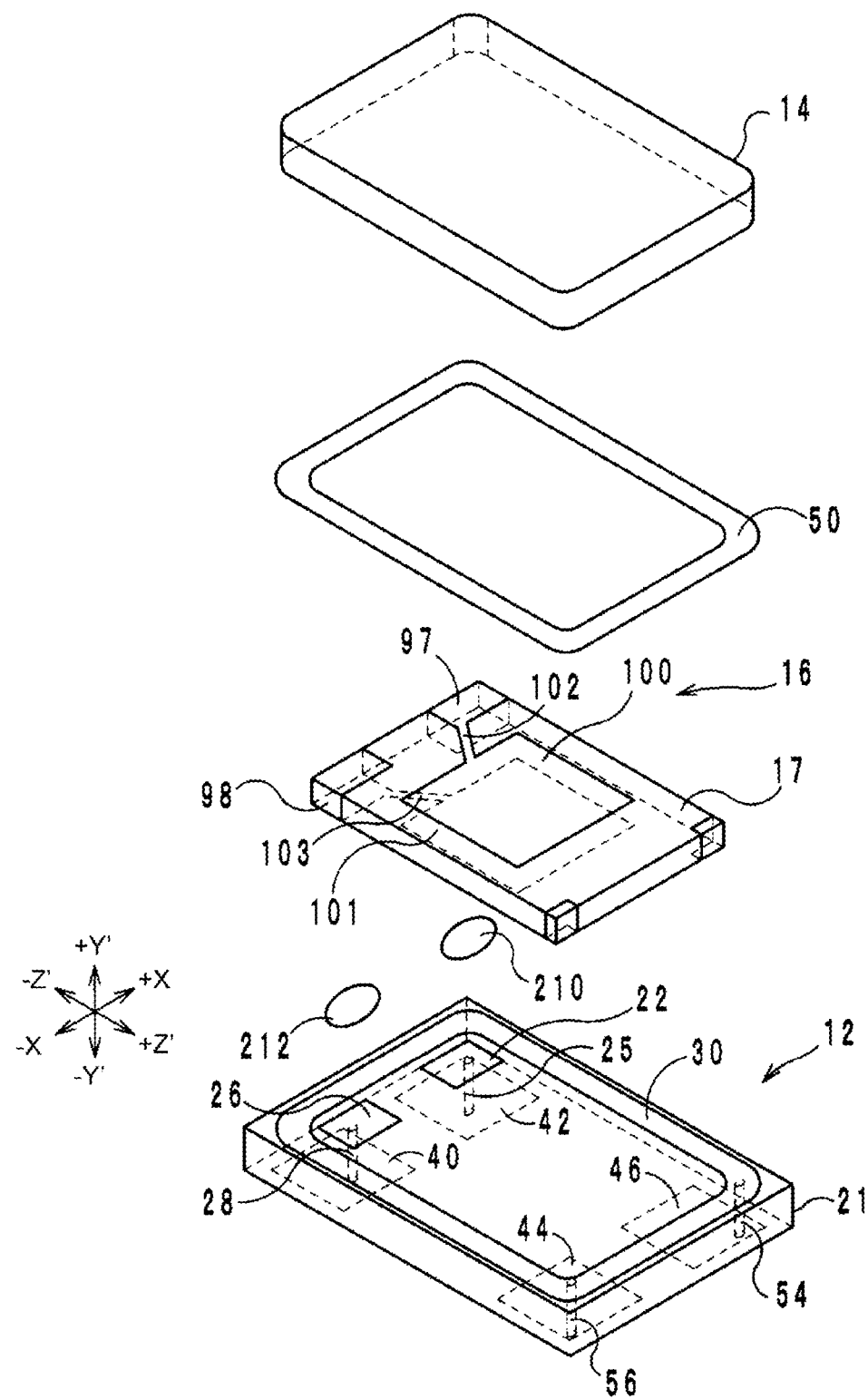
FIG. 2 is an exploded perspective view of the quartz crystal resonator unit 10.
Figure 3:
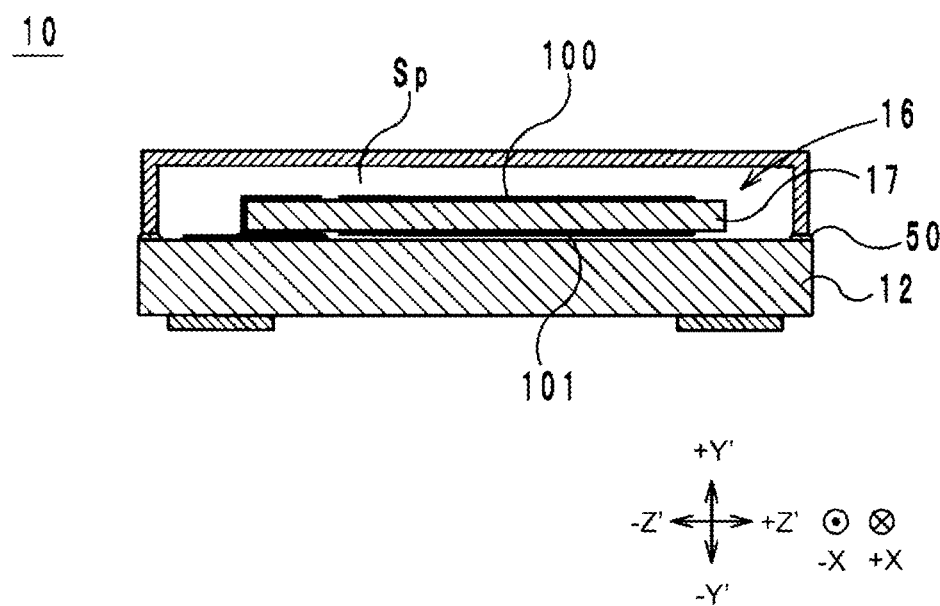
FIG. 3 is a sectional view taken along line A-A of FIG. 1.

Hereinafter, a quartz crystal resonator unit including a quartz crystal resonator according to an embodiment of the present invention will be described with reference to the drawings. FIG. 1 is an external perspective view of a quartz crystal resonator unit 10. FIG. 2 is an exploded perspective view of the quartz crystal resonator unit 10. FIG. 3 is a sectional view taken along line A-A of FIG. 1.

Hereinafter, a direction normal to the main surface of the quartz crystal resonator unit 10 is defined as the vertical direction, a direction in which the long sides of the quartz crystal resonator unit 10 extend when seen from above is defined as the long-side direction, and a direction in which the short sides of the quartz crystal resonator unit 10 extend is defined as the short-side direction. Hereinafter, structures may be described with respect to the axial directions of AT cut of a quartz crystal blank 17.

As illustrated in FIGS. 1 to 3, the quartz crystal resonator unit 10 includes a substrate 12, a metal cap 14, a quartz crystal resonator 16, and a brazing alloy 50. The width of the short sides of the quartz crystal resonator unit 10 is 1.0 mm, and the length of the long sides of the quartz crystal resonator unit 10 is 1.2 mm.

The substrate 12 (an example of a circuit substrate) includes a substrate body 21; outer electrodes 22, 26, 40, 42, 44, and 46; via-hole conductors 25, 28, 54, and 56; and a metalized film 30.

The substrate body 21 is plate-shaped and is rectangular when seen from above. The substrate body 21 is made from, for example, a ceramic insulating material, such as an aluminum oxide sintered compact (so-called alumina). In the present embodiment, the substrate body 21 is a stack of insulating layers made of a ceramic material. The substrate body 21 has an upper main surface and a lower main surface. The upper main surface (main surface on the +Y' side) of the substrate body 21 will be referred to as the "front surface", and the lower main surface (main surface on the -Y' side) of the substrate body 21 will be referred to as the "back surface".

The outer electrodes 22 and 26 are disposed on an end portion of the front surface of the substrate body 21 in the long-side direction so as to be arranged in the short-side direction. To be specific, the outer electrode 22 is a rectangular conductor layer that is disposed near the corner on the -Z' and +X side of the front surface of the substrate body 21. The outer electrode 26 is a rectangular conductor layer that is disposed near the corner on the -Z' and -X side of the front surface of the substrate body 21.

The outer electrodes 40, 42, 44, and 46 are disposed near the respective corners of the back surface of the substrate body 21. The outer electrode 40 is a square conductor layer that is disposed near the corner on the -Z' and -X side of the back surface of the substrate body 21. The outer electrode 40 overlaps the outer electrode 26 when seen from above. The outer electrode 42 is a square conductor layer that is disposed near the corner on the -Z' and +X side of the back surface of the substrate body 21. The outer electrode 42 overlaps the outer electrode 22 when seen from above. The outer electrode 44 is a square conductor layer that is disposed near the corner on the +Z' and -X side of the back surface of the substrate body 21. The outer electrode 46 is a square conductor layer that is disposed near the corner on the +Z' and +X side of the back surface of the substrate body 21.

The via-hole conductor 25 extends through the substrate body 21 in the vertical direction and electrically connects the outer electrode 22 and the outer electrode 42 to each other. The via-hole conductor 28 extends through the substrate body 21 in the vertical direction and electrically connects the outer electrode 26 and the outer electrode 40 to each other.

The metalized film 30 is a linear metal film disposed on the front surface of the substrate body 21. The metalized film 30 is rectangular-ring shaped when seen from above (in the direction normal to the front surface). The outer electrodes 22 and 26 are disposed in a region surrounded by the metalized film 30 when seen from above.

The via-hole conductor 54 extends through the substrate body 21 in the vertical direction and electrically connects the metalized film 30 and the outer electrode 46 to each other. The via-hole conductor 56 extends through the substrate body 21 in the vertical direction and electrically connects the metalized film 30 and the outer electrode 44 to each other.

The structure shown in FIG. 2 may be modified so as to have a structure (not shown) such that excitation signals are transmitted to the outer electrode 40 and the outer electrode 46, which are disposed diagonally on the substrate body 21. The structure according to the modification can be realized by using a substrate having a multilayer structure as the substrate 12. In this case, the via-hole conductor 25 extends through some of the layers of the substrate body and electrically connects the outer electrode 22 to intermediate wiring, which is disposed on an intermediate wiring layer in an intermediate part of the substrate body having a multilayer structure; and the via-hole conductor 54 extends through some of the layers of the substrate body and electrically connects the intermediate wiring to the outer electrode 46. By using the substrate having the multilayer structure, it is possible to electrically connect the outer electrode 22 and the outer electrode 46, which are located at positions that do not overlap in plan view, to each other via the via-hole conductor 25, the intermediate wiring, and the via-hole conductor 54. In this case, the via-hole conductor 54 is not electrically connected to the metalized film 30.

This modification may be further modified so that surface wiring disposed on the surface of the substrate having the multilayer structure is in contact with the outer electrode 42 and the outer electrode 44 so as to electrically connect the outer electrode 42 and the outer electrode 44 to each other. By using such a combination of intermediate wiring and via-hole conductors, it is possible to realize an electricity conducting path that is three-dimensionally routed in a substrate having a multilayer structure. Moreover, it is possible to realize a more complex electricity conducting path by forming an extension electrode that extends from the outer electrode 22 on a main surface of the substrate and connecting a via-hole electrode to the extension electrode.

The outer electrodes 22, 26, 40, 42, 44, and 46 and the metalized film 30 each have a three-layer structure. To be specific, the three-layer structure is formed by stacking a molybdenum layer, a nickel layer, and a gold layer from below. The via-hole conductors 25, 28, 54, and 56 are formed by embedding conductors, such as molybdenum, into via-holes formed in the substrate body 21.

The quartz crystal resonator 16 includes the quartz crystal blank 17, outer electrodes 97 and 98, excitation electrodes 100 and 101, and extension electrodes 102 and 103. The quartz crystal blank 17 is plate-shaped and is rectangular when seen from above. The upper main surface of the quartz crystal blank 17 will be referred to as the "front surface", and the lower main surface of the quartz crystal blank 17 will be referred to as the "back surface".

The quartz crystal blank 17 is an AT-cut quartz crystal blank that is cut from, for example, a rough quartz crystal at a predetermined angle. The AT-cut quartz crystal blank 17 is cut as follows: when an X axis, a Y axis, and a Z axis are the crystal axes of an artificial quartz crystal and a Y' axis and the Z' axis are respectively axes that are obtained by rotating the Y axis and the Z axis around the X axis by 35 degrees 15±1 minutes 30 seconds in the direction from the Y axis toward the Z axis, the quartz crystal blank 17 has a main surface that is parallel to a plane defined by the X axis and the Z' axis. As illustrated in FIG. 2, the long sides of the front surface and the back surface of the quartz crystal blank 17 are substantially parallel to the Z' axis of the quartz crystal blank 17. The short sides of the front surface and the back surface of the quartz crystal blank 17 are substantially parallel to the X axis of the quartz crystal blank 17. The thickness of the quartz crystal blank 17 in a direction perpendicular to the front surface or the back surface of the quartz crystal blank 17 is substantially parallel to the Y' axis of the quartz crystal blank 17. Here, "substantially parallel" allows deviation within ±1 degree relative to the Z' axis and the X axis. A quartz crystal resonator using an AT-cut quartz crystal blank can be manufactured so as to have extremely high frequency stability in a wide temperature range and have characteristics that are highly stable over time. Moreover, an AT-cut quartz crystal resonator includes a thickness shear mode as a main vibration. The quartz crystal blank 17 is beveled. However, in each of FIGS. 2 and 3, beveled portions are not illustrated.

The quartz crystal resonator unit is sized so that the length in the long-side direction is 1.2 mm and the width in the short-side direction is 1.0 mm. To achieve this size, in consideration of the thickness of a package wall, bleeding of a molding compound, and the precision of mounting an element, for example, the quartz crystal blank 17 is designed so as have a length of 0.80 mm or smaller in the long-side direction and a width of 0.67 mm or smaller in the short-side direction.

The outer electrode 97 is a conductor layer that is disposed in a region including the corner on the −Z' and +X side of the quartz crystal blank 17. The outer electrode 97 is formed on the front surface and the back surface of the quartz crystal blank 17 and also on side surfaces on the +X side and the −Z' side of the quartz crystal blank 17. Thus, the outer electrode 97 is in contact with end portions, in the +X direction, of the short sides of the front surface and the back surface. The outer electrode 98 is a conductor layer that is disposed in a region including the corner on the −Z' and −X side of the quartz crystal blank 17. The outer electrode 98 is formed on the front surface and the back surface of the quartz crystal blank 17 and also on side surfaces on the −X side and the −Z' side of the quartz crystal blank 17. Thus, the outer electrode 98 is in contact with end portions, in the −X direction, of the short sides of the front surface and the back surface. Thus, the outer electrodes 97 and 98 are arranged in the short-side direction of the quartz crystal blank 17.

The excitation electrode 100 is disposed at the center of the front surface of the quartz crystal blank 17 and is rectangular when seen from above. The excitation electrode 101 is disposed at the center of the back surface of the quartz crystal blank 17 and is rectangular when seen from above. The excitation electrode 100 and the excitation electrode 101 completely overlap each other when seen from above.

The extension electrode 102 is disposed on the front surface of the quartz crystal blank 17 and connects the outer electrode 97 and the excitation electrode 100 to each other. The extension electrode 103 is disposed on the back surface of the quartz crystal blank 17 and connects the outer electrode 98 and the excitation electrode 101 to each other. The outer electrodes 97 and 98, the excitation electrodes 100 and 101, and the extension electrodes 102 and 103 are each formed, for example, by stacking a gold layer on a chrome underlying layer.

The quartz crystal resonator 16 is mounted on the front surface of the substrate 12. To be specific, the outer electrode 22 and the outer electrode 97 are fixed to each other so as to be electrically connected to each other by using an electroconductive adhesive 210, and the outer electrode 26 and the outer electrode 98 are fixed to each other so as to be electrically connected to each other by using an electroconductive adhesive 212. Examples of the electroconductive adhesives 210 and 212 include silicone-based electroconductive adhesives.

The metal cap 14 is a housing that has a rectangular opening. The metal cap 14 is made, for example, by plating a base metal, such as an iron-nickel alloy or a cobalt-nickel alloy, with nickel and gold. In the present embodiment, the metal cap 14 is a rectangular-parallelepiped box whose lower side is open. The metal cap 14 is made by plating a base metal, which is an iron-nickel alloy, with nickel and gold.

The brazing alloy 50 is disposed on the metalized film 30. The brazing alloy 50 has substantially the same shape as the metalized film 30 and is rectangular-ring shaped. The brazing alloy 50 has a melting point lower than that of the metalized film 30 and is made of, for example, a gold-tin alloy. The brazing alloy 50 is formed on the metalized film 30 by, for example, printing or the like. The metalized film 30 is melted and solidified in a state in which the outer edge of the opening of the metal cap 14 is in contact with the brazing alloy 50. Thus, the metal cap 14 is joined to the metalized film 30 via the brazing alloy 50 along the entire length of the outer edge of the opening. As a result, the front surface of the substrate body 21 and the metal cap 14 form a hermetically sealed space Sp. Accordingly, the quartz crystal resonator 16 is contained in the hermetically sealed space Sp. Since the metal cap 14 is in close contact with the substrate body 21 via the metalized film 30 and the brazing alloy 50, the hermetically sealed space Sp is maintained in a vacuum state. However, the space Sp may be in an atmospheric state. Instead of the brazing alloy 50, for example, an adhesive made of low-melting-point glass, a resin, or the like may be used. In this case, the metalized film 30 may be omitted.

The outer electrodes 40 and 42 of the quartz crystal resonator unit 10 are electrically connected to an oscillation circuit, and the oscillation circuit outputs a timing signal. A ground potential is applied to the outer electrodes 44 and 46.

In order to reduce the CI value, the quartz crystal resonator unit 10 according to the present embodiment satisfies the following conditions.

Condition 1: The frequency of a main vibration of the quartz crystal blank 17 is in the range of 20.0 MHz to 60.0 MHz.

Condition 2: The long sides of the front surface and the back surface of the quartz crystal blank 17 are substantially parallel to the Z' axis of the quartz crystal blank 17.

Condition 3: The short sides of the front surface and the back surface of the quartz crystal blank 17 are substantially parallel to the X axis of the quartz crystal blank 17.

Condition 4: $0.050 \leq P \leq -0.0047 \times F + 1.728$ is satisfied, where P (mm) is the minimum distance between a portion where the electroconductive adhesive 210 is in contact with the quartz crystal resonator 16 and a portion where the electroconductive adhesive 212 is in contact with the quartz crystal resonator 16 in the short-side direction, and F (MHz) is the frequency of the main vibration of the quartz crystal blank 17.

<Regarding Condition 1>

The frequency of the main vibration of the quartz crystal blank 17 depends on the thickness T of the quartz crystal blank 17. Accordingly, the thickness T of the quartz crystal blank 17 is set in the range of 0.0278 mm to 0.0835 mm.

<Regarding Conditions 2 and 3>

In general, a quartz crystal blank is fixed to a substrate by bonding a part of the quartz crystal blank near a short side thereof to the substrate by using an electroconductive adhesive. Moreover, it is known that the vibration direction of a thickness shear vibration of an AT-cut quartz crystal blank is the X-axis direction. Accordingly, an existing quartz crystal blank whose long sides are parallel to the X axis is likely to influence the substrate due to vibration leakage via the electroconductive adhesive near the short side. In contrast, in the AT-cut quartz crystal blank 17 according to the present embodiment, vibration leakage to a Z' axis region is small, because the long sides are parallel to the Z' axis. Therefore, even when the quartz crystal blank 17 is fixed to the substrate 12 by bonding parts of the quartz crystal blank 17 near a short side thereof by using the electroconductive adhesives 210 and 212, the influence of vibration leakage on the substrate 12 is small. Accordingly, with the AT-cut quartz crystal blank according to the present embodiment, the influence of vibration leakage is smaller and the CI value is better than a quartz crystal blank whose long sides are parallel to the X axis.

<Regarding Condition 4>

$0.050 \leq P \leq -0.0047 \times F + 1.728$ is satisfied, where P (mm) is the minimum distance between a portion where the electroconductive adhesive 210 is in contact with the quartz crystal resonator 16 and a portion where the electroconductive adhesive 212 is in contact with the quartz crystal resonator 16 in the short-side direction, and F (MHz) is the frequency of the main vibration of the quartz crystal blank 17. Preferably, $0.370 \leq P \leq 0.683$ is satisfied, when the frequency of the main vibration of the quartz crystal blank 17 is 37.4 MHz. The portion where the electroconductive adhesive 210 is in contact with the quartz crystal resonator 16 and the portion where the electroconductive adhesive 212 is in contact with the quartz crystal resonator 16 are portions where the quartz crystal resonator 16 is fixed to the substrate 12 via the electroconductive adhesives 210 and 212. That is, the term "minimum distance P" refers to the minimum distance between a portion where the quartz crystal resonator 16 is fixed to the substrate 12 via the electroconductive adhesive 210 and a portion where the quartz crystal resonator 16 is fixed to the substrate 12 via the electroconductive adhesive 212. In the present exemplary embodiment, the electroconductive adhesives 210 and 212 are applied so as not to extend beyond the edges of the outer electrodes 97 and 98 when seen from above. Accordingly, the portion where the electroconductive adhesive 210 is in contact with the quartz crystal resonator 16 and the portion where the electroconductive adhesive 212 is in contact with the quartz crystal resonator 16 are respectively the portion where the electroconductive adhesive 210 is in contact with the outer electrode 97 and the portion where the electroconductive adhesive 212 is in contact with the outer electrode 98.

(Method of Manufacturing Quartz Crystal Resonator Unit)

Hereinafter, a method of manufacturing the quartz crystal resonator unit 10 will be described with reference to the drawings.

First, a method of manufacturing the substrate 12 will be described. A mother substrate in which a plurality of substrate bodies 21 are arranged in a matrix pattern is prepared. The mother substrate is made from, for example, a ceramic insulating material, such as an aluminum oxide sintered compact (so-called alumina).

Next, through-holes are formed by irradiating, with a beam, positions on the mother substrate at which the via-hole conductors 25, 28, 54, and 56 of the substrate body 21 are to be formed. Moreover, the through-holes are filled with an electroconductive material, such as molybdenum, and the electroconductive material is dried. Subsequently, the via-hole conductors 25, 28, 54, and 56 are formed by firing the electroconductive material.

Next, underlying electrodes of the outer electrodes 40, 42, 44, and 46 are formed on the back surface of the mother substrate. To be specific, a molybdenum layer is printed on the back surface of the mother substrate and dried. Subsequently, the molybdenum layer is fired. Thus, the underlying electrodes of the outer electrodes 40, 42, 44, and 46 are formed.

Next, underlying electrodes of the outer electrodes 22 and 26 and the metalized film 30 are formed on the front surface of the mother substrate. A molybdenum layer is printed on the front surface of the mother substrate and dried. Subsequently, the molybdenum layer is fired. Thus, the underlying electrodes of the outer electrodes 22 and 26 and the metalized film 30 are formed.

Next, the underlying electrodes of the outer electrodes 40, 42, 44, 46, 22, and 26 and the metalized film 30 are plated with nickel and gold in this order. Thus, the outer electrodes 40, 42, 44, 46, 22, and 26 and the metalized film 30 are formed.

Here, by using a vacuum printing method or the like, it is possible to simultaneously perform filling of the through-holes with the electroconductive material and printing of the outer electrodes and the like on the mother substrate. At this time, the electroconductive material, the outer electrodes, and the like are simultaneously fired.

When the mother substrate is made from a ceramic sintered compact insulating material, while the mother substrate is shaped like a sheet before being fired, through-holes are formed, the through-holes are filled with the electroconductive material, and the outer electrodes 22, 26, 40, 42, 44, and 46 and the metalized film 30 are printed and dried. Subsequently, a plurality of such sheets are stacked and pressed to form stacked sheets. By firing the stacked sheets, it is possible to simultaneously form the via-hole conductors; the outer electrodes 22, 26, 40, 42, 44, and 46; the metalized film 30; and the substrate body 21. Subsequently, plating is performed in the same way as described above.

Next, the mother substrate is divided into a plurality of substrate bodies 21 by using a dicer. Alternatively, division grooves may be formed in the mother substrate by irradiating the mother substrate with a laser beam, and then the mother substrate may be mechanically divided into a plurality of substrate bodies 21 along the division grooves.

Next, a method of manufacturing the quartz crystal resonator 16 will be described. The quartz crystal blank 17, which is rectangular plate-shaped, is obtained by AT-cutting a rough quartz crystal. At this time, the rough quartz crystal is cut so that the long sides of the front surface and the back surface of the quartz crystal blank 17 are substantially parallel to the Z' axis of the quartz crystal blank 17 and the short sides of the front surface and the back surface of the quartz crystal blank 17 are substantially parallel to the X axis of the quartz crystal blank 17.

Next, the quartz crystal blank 17 is beveled by using a barrel finishing apparatus. Thus, ridge portions of the quartz crystal blank 17 are ground, and the quartz crystal blank 17 has a cross-sectional shape such that the thickness thereof decreases with increasing distance from the center of the front surface.

Next, the outer electrodes 97 and 98, the excitation electrodes 100 and 101, and the extension electrodes 102 and 103 are formed on the quartz crystal blank 17. Since the outer electrodes 97 and 98, the excitation electrodes 100 and 101, and the extension electrodes 102 and 103 can be formed through a general process, the description of the process will be omitted.

Next, the quartz crystal resonator 16 is mounted on the front surface of the substrate body 21. To be specific, as illustrated in FIGS. 2 and 3, the outer electrode 22 and the outer electrode 97 are bonded to each other by using the electroconductive adhesive 210, and the outer electrode 26 and the outer electrode 98 are bonded to each other by using the electroconductive adhesive 212. At this time, in order to cure a thermosetting resin in the electroconductive adhesives 210 and 212, the substrate 12, the quartz crystal resonator 16, and the electroconductive adhesives 210 and 212 are heated to 180° C.

Next, the metal cap 14 is attached to the substrate 12 by using the brazing alloy 50. Through the process described above, the quartz crystal resonator unit 10 is completed.

Advantageous Effects

Figure 4:
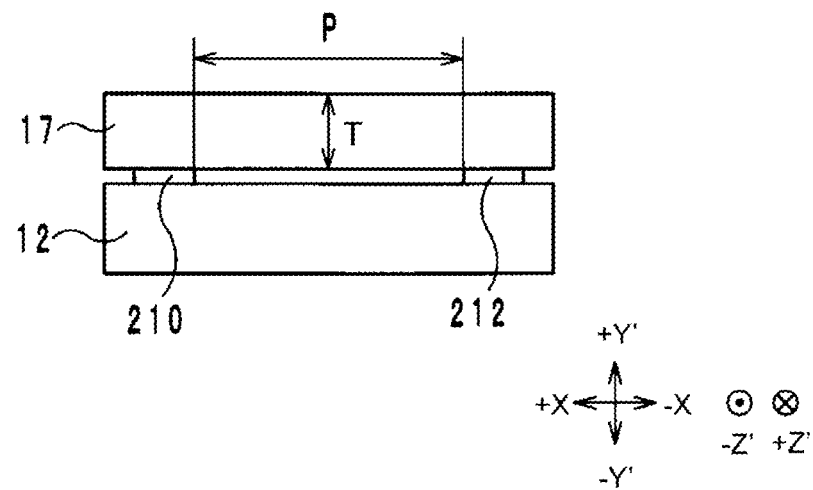
FIG. 4 illustrates a model used in a computer simulation performed by the inventors, as seen from the −Z' side.

With the quartz crystal resonator 16 and the quartz crystal resonator unit 10 according to the present embodiment, the CI value can be reduced, because the conditions 1 to 4 are satisfied. FIG. 4 illustrates a model used in a computer simulation performed by the inventors, as seen from the left side. FIG. 5 illustrates the model used in the computer simulation performed by the inventors, as seen from the upper side.

The inventors performed a computer simulation described below in order to examine an appropriate distance P of the quartz crystal blank 17, whose long sides of the front surface and the back surface are substantially parallel to the Z' axis of the quartz crystal blank 17 (hereinafter, referred to as a "Z-long quartz crystal blank). The inventors made first to fifteenth models (described below) and computed the maximum stress applied to the quartz crystal blank 17. The maximum stress occurs in the portions where the electroconductive adhesives 210 and 212 are in contact with the quartz crystal blank 17. Here, the stress is von Mises equivalent stress.

Simulation conditions are as described below. Referring to FIGS. 4 and 5, the inventors made a model in which the quartz crystal blank 17 is fixed to the substrate 12 by using the electroconductive adhesives 210 and 212. At this time, the inventors changed the frequency F of the main vibration of the quartz crystal blank 17 by changing the thickness of the quartz crystal blank 17 to three levels. Moreover, for each of the models of the quartz crystal blank 17 having the three thicknesses, the distance P was changed to five levels. Table 1 shows the conditions for the quartz crystal blank 17, Table 2 shows the conditions for the substrate 12, and Table 3 shows the conditions for the electroconductive adhesives 210 and 212. Table 4 shows the distance P of the first to fifteenth models.

TABLE 1

| | |
|---|---|
| Length (mm) | 2.200 |
| Width (mm) | 2.000 |
| Thickness (mm) of First to Fifth Models | 0.0835 |
| Thickness (mm) of Sixth to Tenth Models | 0.0447 |
| Thickness (mm) of Eleventh to Fifteenth Models | 0.0278 |
| Coefficient of Linear Expansion (ppm/° C.) in X-axis Direction | 13.0 |
| Coefficient of Linear Expansion (ppm/° C.) in Z'-axis Direction | 10.0 |

TABLE 2

| | |
|---|---|
| Length (mm) | 2.500 |
| Width (mm) | 2.000 |
| Thickness (mm) | 0.125 |
| Coefficient of Linear Expansion (ppm/° C.) | 7.2 |
| Young's Modulus (GPa) | 315 |

TABLE 3

| | |
|---|---|
| Diameter (mm) | 0.130 |
| Thickness (mm) | 0.006 |
| Coefficient of Linear Expansion (ppm/° C.) | 30.0 |
| Young's Modulus (GPa) | 0.40 |

TABLE 4

| Frequency | Distance P (mm) | | | | |
|---|---|---|---|---|---|
| (MHz) | 0.54 | 0.74 | 0.94 | 1.34 | 1.74 |
| 20.0 | First Model | Second Model | Third Model | Fourth Model | Fifth Model |
| 37.4 | Sixth Model | Seventh Model | Eighth Model | Ninth Model | Tenth Model |
| 60.0 | Eleventh Model | Twelfth Model | Thirteenth Model | Fourteenth Model | Fifteenth Model |

Figure 6:
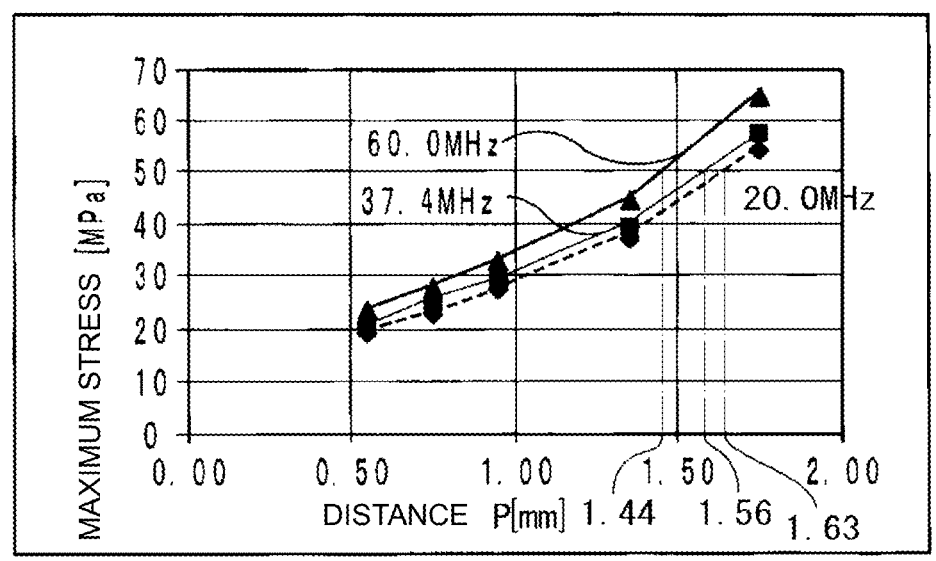
FIG. 6 is a graph representing the results of the simulation.

FIG. 6 is a graph representing the results of the simulation. The vertical axis represents the maximum stress (MPa), and the horizontal axis represents the distance P (mm).

In a general quartz crystal resonator unit, the long sides of the front surface and the back surface are substantially parallel to the X axis of the quartz crystal blank (hereinafter, referred to as an "X-long"). An X-long quartz crystal resonator unit whose width in the short-side direction is 2.0 mm and whose width in the long-side direction is 2.5 mm is designed so that the maximum stress is 50 MPa or smaller. It is empirically known that, with such a design, the CI value of the quartz crystal resonator unit is controlled to be sufficiently low (to be specific, 70Ω or lower). The inventors obtained the following results by reading, from the graph of FIG. 6, the distance P for each of the frequencies of the main vibration of the quartz crystal blank 17 (that is, for each of the thicknesses of the quartz crystal blank 17) at which the maximum stress is 50 MPa.

20 MHz: P=1.63 mm
37.4 MHz: P=1.56 mm
60 MHz: P=1.44 mm

Figure 7:
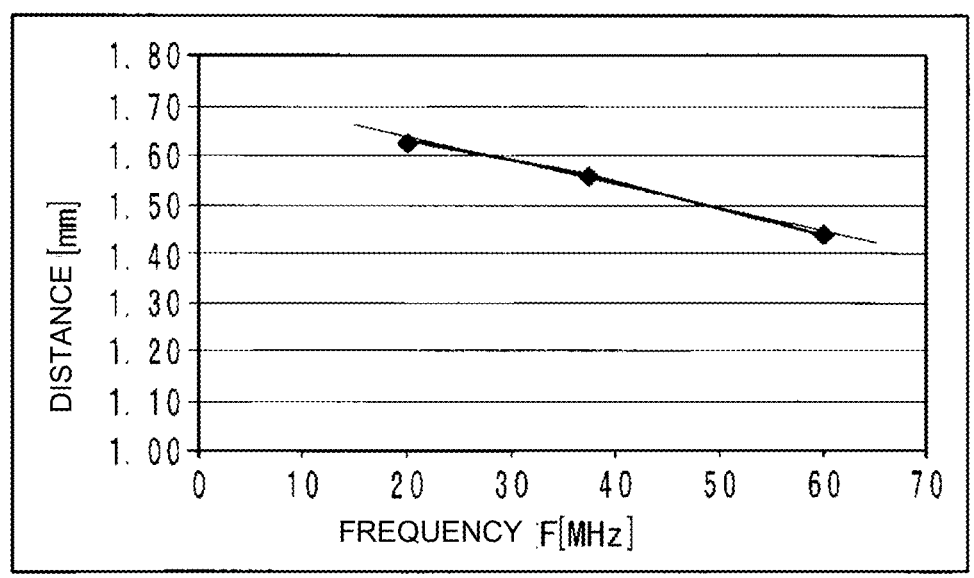
FIG. 7 is a graph representing the relationship between the distance P (mm) and the frequency F (MHz) of a main vibration.

The inventors drew a graph of FIG. 7 on the basis of the above results. FIG. 7 is a graph representing the relationship between the distance P (mm) and the frequency F (MHz) of the main vibration. The vertical axis represents the distance P, and the horizontal axis represents the frequency F.

Referring to FIG. 7, the three points are substantially on a straight line. By using the method of least squares, the straight line is represented by an equation $P=-0.0047 \times F+1.728$. Accordingly, the maximum stress is 50 MPa or smaller, provided that the distance P is on or below the straight line. That is, the CI value is controlled to be low (70Ω or smaller), provided that $P \leq -0.0047 \times F+1.728$ is satisfied.

Note that the lower limit of the distance P is 0.050 mm. This is because, if the distance P is smaller than 0.050 mm, the electroconductive adhesive 210 and the electroconductive adhesive 212 are too close to each other and a short circuit may occur.

Figure 8:
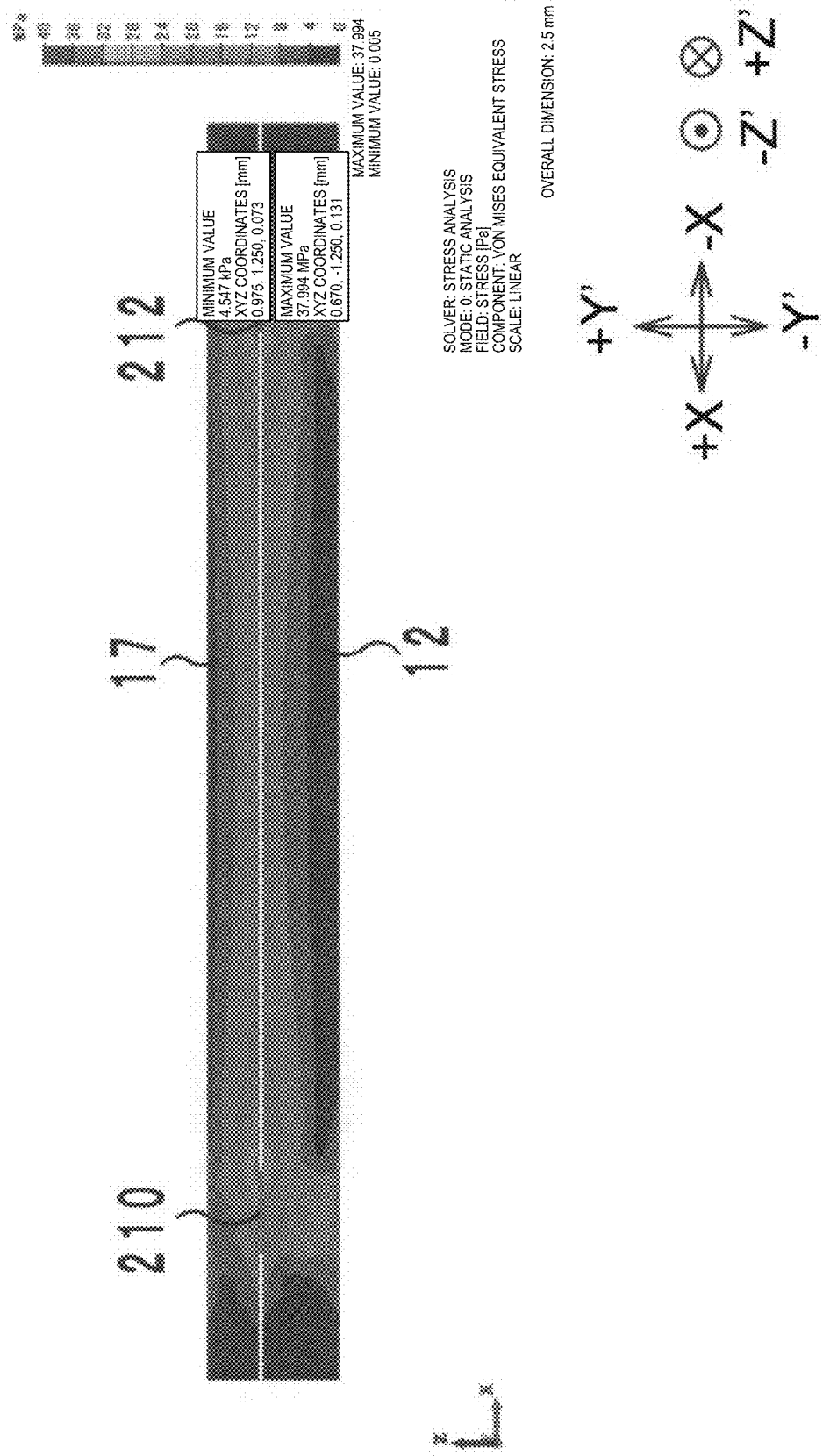
FIG. 8 illustrates the stress distribution of a quartz crystal blank 17 in a fourth sample.
Figure 9:
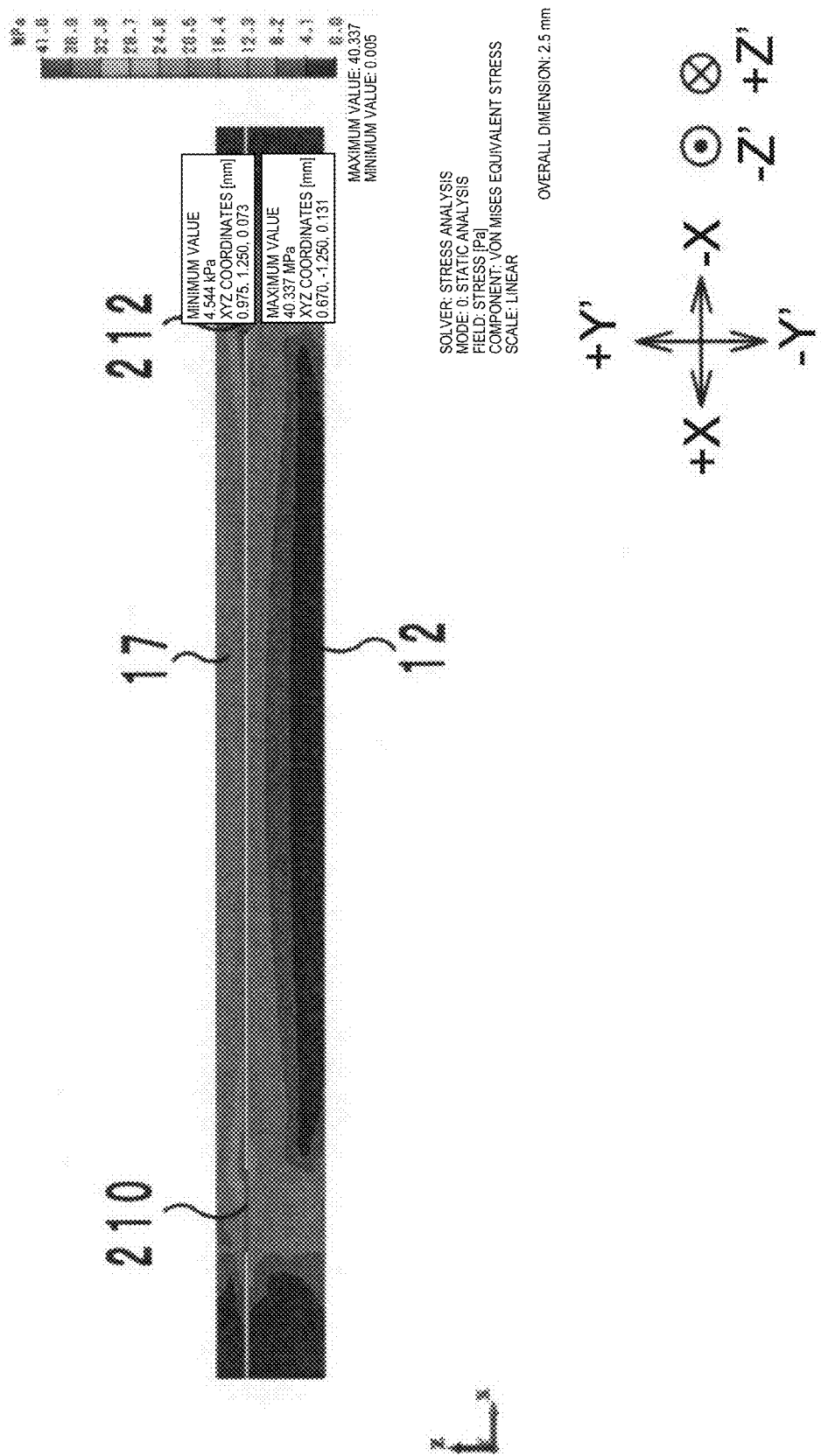
FIG. 9 illustrates the stress distribution of a quartz crystal blank 17 in a ninth sample.
Figure 10:
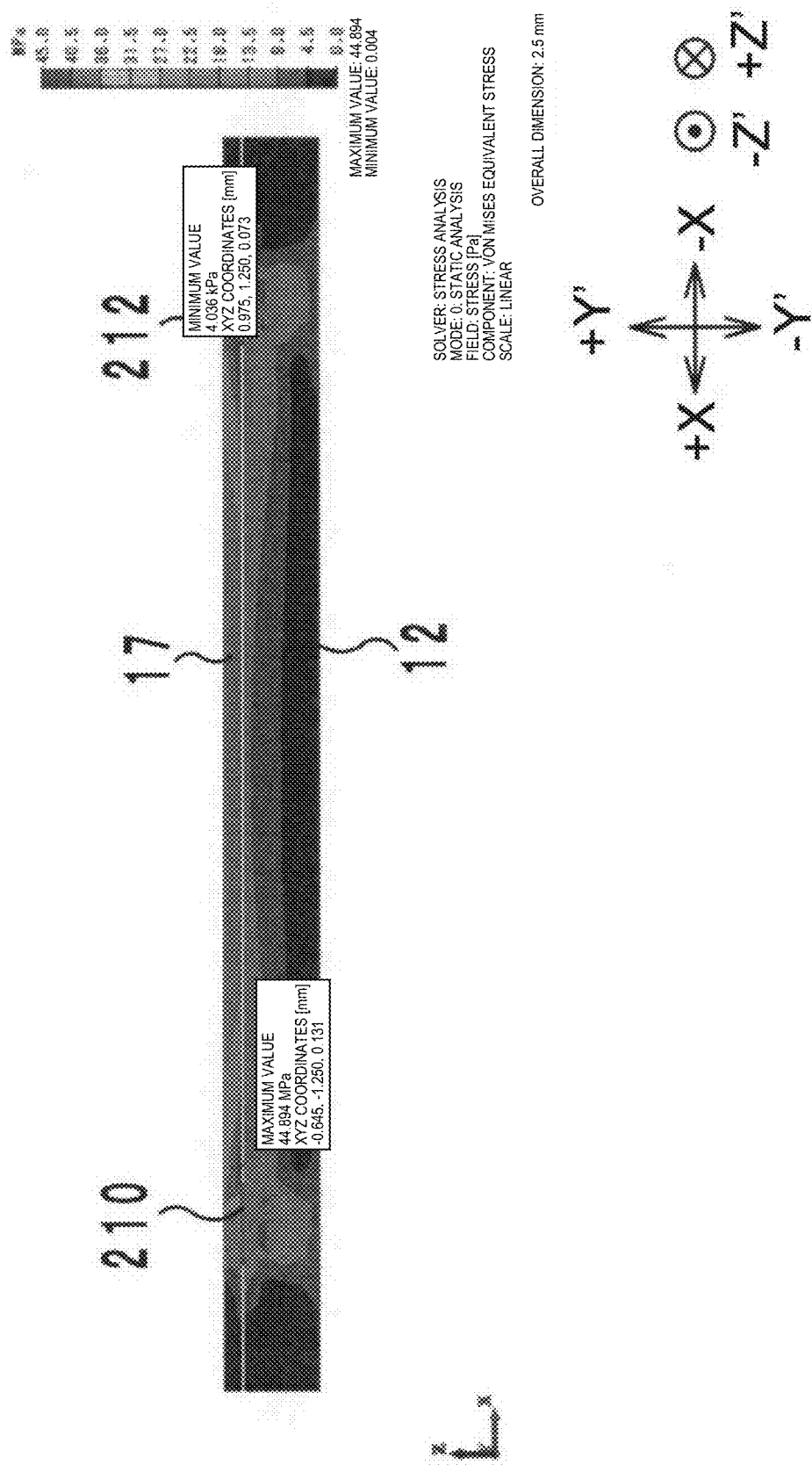
FIG. 10 illustrates the stress distribution of a quartz crystal blank 17 in a fourteenth sample.
Figure 11:
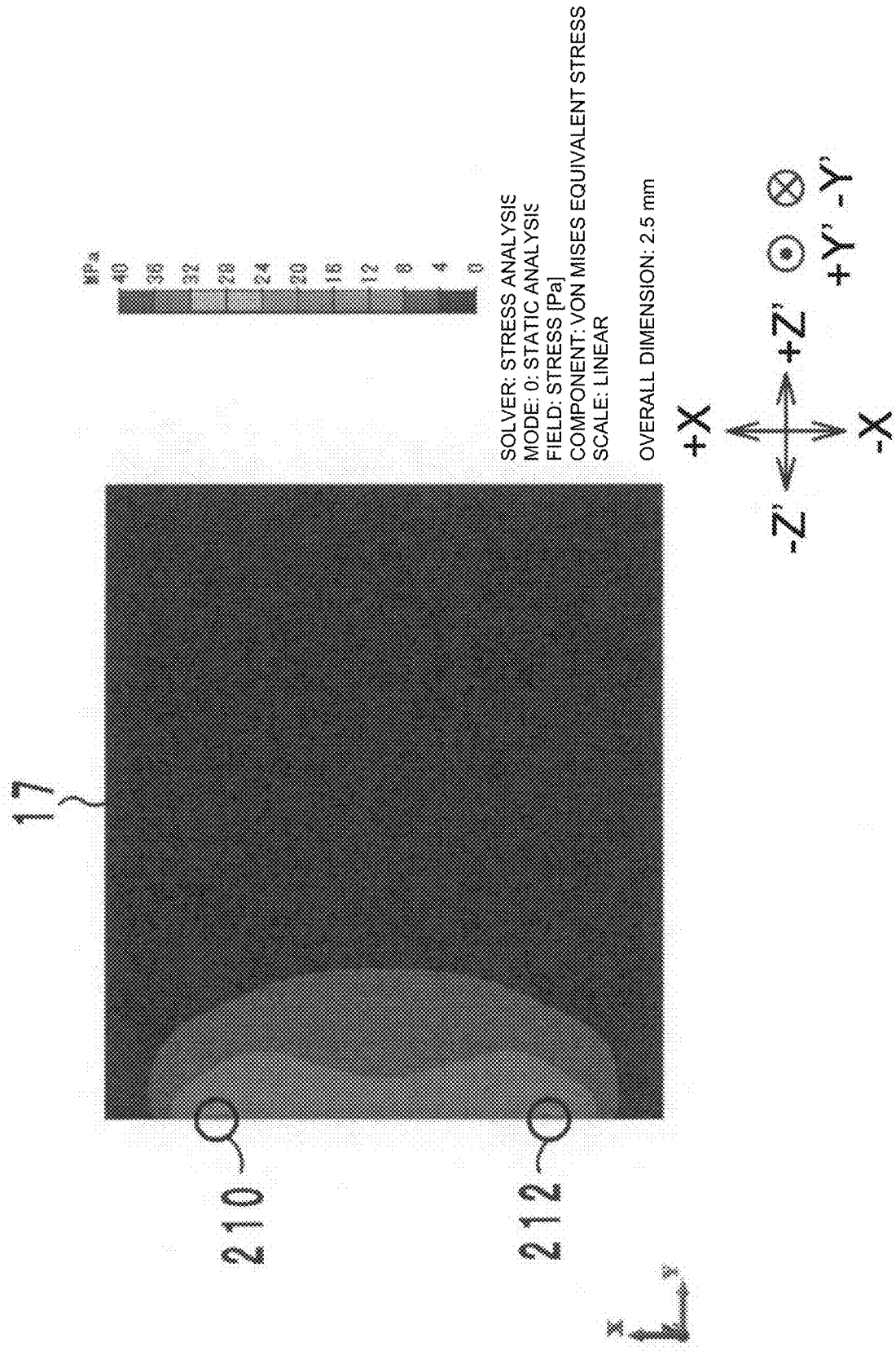
FIG. 11 illustrates the stress distribution of the quartz crystal blank 17 in the ninth sample.

It is known that the width of the quartz crystal blank 17 in the short-side direction and the length of the quartz crystal blank 17 in the long-side direction do not contribute or only negligibly contribute to reduction of the CI value. FIG. 8 illustrates the stress distribution of a quartz crystal blank 17 in the fourth sample. FIG. 9 illustrates the stress distribution of a quartz crystal blank 17 in the ninth sample. FIG. 10 illustrates the stress distribution of a quartz crystal blank 17 in the fourteenth sample. FIG. 11 illustrates the stress distribution of the quartz crystal blank 17 in the ninth sample. FIGS. 8 to 10 each illustrate the sample seen from the left side. FIG. 11 illustrates the sample seen from the upper side.

As can be seen from FIGS. 8 to 10, the stress concentrates in a portion of the quartz crystal blank 17 near an end, in the −X direction, of the electroconductive adhesive 210 and in a portion of the quartz crystal blank 17 near an end, in the +X direction, of the electroconductive adhesive 212. That is, no stress or only a negligible stress is generated in a portion of the quartz crystal blank 17 in the +X direction from the electroconductive adhesive 210 and in a portion of the quartz crystal blank 17 in the −X direction from the electroconductive adhesive 212. Accordingly, the portion of the quartz crystal blank 17 in the +X direction from the electroconductive adhesive 210 and the portion of the quartz crystal blank 17 in the −X direction from the electroconductive adhesive 212 may have any length.

As can be seen from FIG. 11, the stress concentrates in portions of the quartz crystal blank 17 near the upper sides of the electroconductive adhesives 210 and 212. That is, no stress or only a negligible stress is generated in portions of the quartz crystal blank 17 in the +Z' direction from the electroconductive adhesives 210 and 212. Therefore, the portions of the quartz crystal blank 17 in the +Z' direction from the electroconductive adhesives 210 and 212 may have any length. Preferably, the length of the long sides of the front surface and the back surface (that is, the length in the long-side direction) of the quartz crystal blank 17 is 2.0 mm or smaller. This is because, if the length of the quartz crystal blank 17 in the long-side direction is too large, the quartz crystal blank 17 is heavy and a high load is applied to the electroconductive adhesives 210 and 212.

Next, the inventors performed the following experiment in order to obtain a preferable value of the distance P. To be specific, the inventors made first to third samples (shown below) and measured the CI value. The CI value was measured by using a network analyzer (E5100A made by Agilent Technologies). The experiment was performed at 25° C. (room temperature). Table 5 shows the conditions for the length, the width, and the distance P of the quartz crystal blank 17 and the excitation electrodes 100 and 101 of the first to third samples. As shown in Table 5, the distance P differed among the first to third samples.

TABLE 5

|  | First Sample | Second Sample | Third Sample |
| --- | --- | --- | --- |
| Frequency (MHz) | 37.4 | 37.4 | 37.4 |
| Thickness (mm) | 0.0447 | 0.0447 | 0.0447 |
| Distance P (mm) | 0.370 | 0.500 | 0.683 |
| Length (mm) | 1.350 | 1.350 | 1.350 |
| Width (mm) | 0.943 | 0.943 | 0.943 |
| Electrode Length (mm) | 0.50 | 0.50 | 0.50 |
| Electrode Width (mm) | 0.50 | 0.50 | 0.50 |

Figure 12:
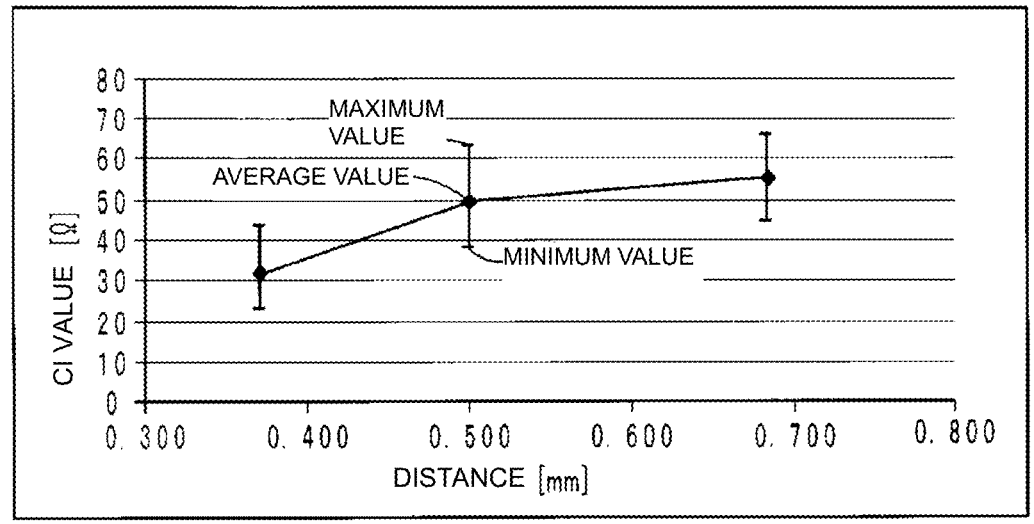
FIG. 12 is graph representing the results of an experiment.

FIG. 12 is a graph representing an experiment performed on the samples shown in Table 5, each having a frequency of 37.4 MHz. The vertical axis represents the CI value, and the horizontal axis represents the distance P. As can be seen from FIG. 12, the CI value of the quartz crystal resonator unit 10, whose main vibration has a frequency of 37.4 MHz, can be controlled to be 70Ω or lower, provided that the distance P is in the range of 0.370 mm to 0.683 mm. Thus, preferably, 0.370 mm P 0.683 mm is satisfied, when the frequency of the main vibration of the quartz crystal blank 17 is 37.4 MHz.

Modification

Figure 13:
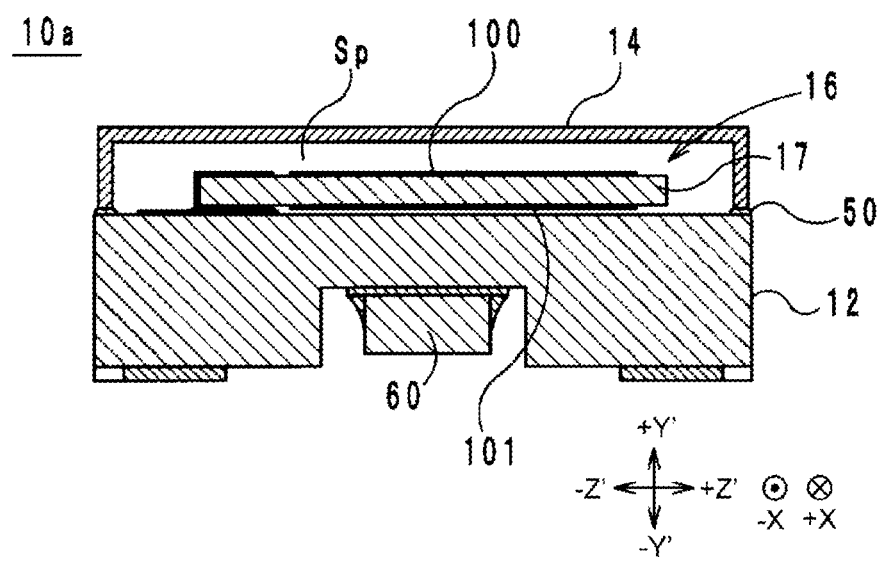
FIG. 13 is a sectional view of a quartz crystal resonator unit 10a according to a modification.

Hereinafter, a quartz crystal resonator unit 10a according to a modification will be described with reference to the drawings. FIG. 13 is a sectional view of the quartz crystal resonator unit 10a according to the modification.

As illustrated in FIG. 13, the quartz crystal resonator unit 10a according to the present modification includes a quartz crystal resonator 16 including a quartz crystal blank 17, and differs from the quartz crystal resonator unit 10 according to the embodiment described above in that a thermistor 60 is disposed on a back surface of a substrate 12. As the quartz crystal blank 17, a quartz crystal blank according to the embodiment described above can be used.

(Quartz Crystal Oscillator)

Figure 14:
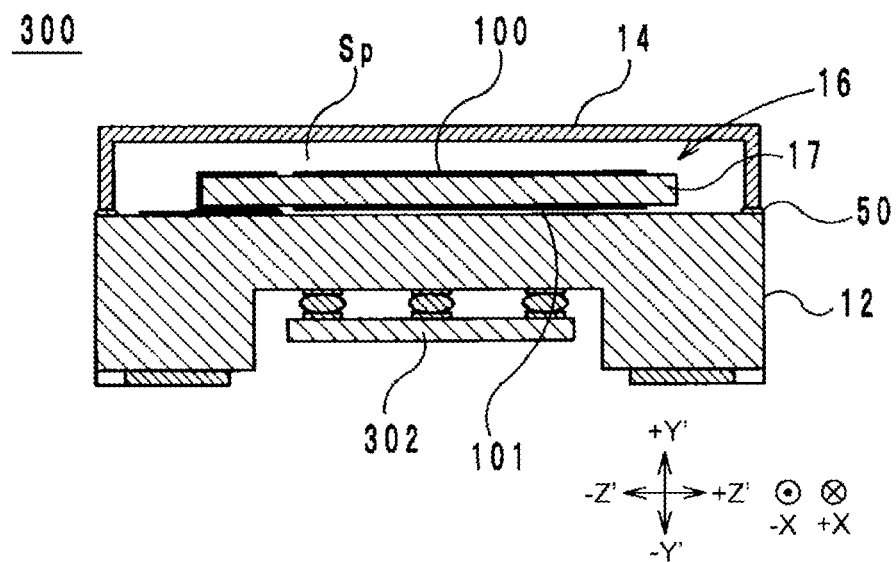
FIG. 14 is a sectional view of a quartz crystal oscillator 300.

Hereinafter, a quartz crystal oscillator 300 including a quartz crystal blank 17 will be described with reference to the drawings. FIG. 14 is a sectional view of the quartz crystal oscillator 300.

As illustrated in FIG. 14, the quartz crystal oscillator 300 includes a quartz crystal resonator 16 including the quartz crystal blank 17, and differs from the quartz crystal resonator unit 10 illustrated in FIG. 3 in that an IC 302 is mounted on a back surface of a substrate 12. As the quartz crystal blank 17, a quartz crystal blank according to the embodiment described above can be used.

Other Embodiments

A quartz crystal resonator and a quartz crystal resonator unit according to the present invention are not limited to the quartz crystal resonator 16 and the quartz crystal resonator unit 10, and may be modified within the scope of the present invention.

The minimum distance P is the minimum distance between a portion where the electroconductive adhesive 210 is in contact with the quartz crystal resonator 16 and a portion where the electroconductive adhesive 212 is in contact with the quartz crystal resonator 16 in the short-side direction. Alternatively, for the following reason, the minimum distance P may be the minimum distance between the outer electrode 97 and the outer electrode 98 in the short-side direction.

There is a case where the electroconductive adhesive 210 is applied so as to be in contact with an edge of the outer electrode 97 on the −X side and the electroconductive adhesive 212 is applied so as to be in contact with an edge of the outer electrode 98 on the +X side. In this case, the minimum distance between a portion where the electroconductive adhesive 210 is in contact with the quartz crystal resonator 16 and a portion where the electroconductive adhesive 212 is in contact with the quartz crystal resonator 16 in the short-side direction coincides with the minimum distance between the outer electrode 97 and the outer electrode 98 in the short-side direction. Therefore, the minimum distance P may be the minimum distance between the outer electrode 97 and the outer electrode 98 in the short-side direction.

There is a case where the electroconductive adhesives 210 and 212 are respectively applied so as to extend beyond the edges of the outer electrodes 97 and 98 when seen from above. In particular, there is a case where the electroconductive adhesive 210 is applied so as to extend beyond the edge of the outer electrode 97 in the −X direction and the electroconductive adhesive 212 is applied so as to extend beyond the edge of the outer electrode 98 in the +X direction. In this case, the minimum distance P between a portion where the electroconductive adhesive 210 is in contact with the quartz crystal resonator 16 and a portion where the electroconductive adhesive 212 is in contact with the quartz crystal resonator 16 in the short-side direction is the minimum distance between a portion where the electroconductive adhesive 210 is in contact with the quartz crystal blank 17 and a portion where the electroconductive adhesive 212 is in contact with the quartz crystal blank 17. Thus, the phrase "portions where the electroconductive adhesives 210 and 212 are in contact with the quartz crystal resonator 16" refers to portions where the electroconductive adhesives 210 and 212 are in contact with the quartz crystal blank 17 or the outer electrodes 97 and 98.

As described above, the present invention can be used for a quartz crystal resonator and a quartz crystal resonator unit and, in particular, advantageous in that the CI value can be reduced.

REFERENCE SIGNS LIST 10, 10a quartz crystal resonator unit
12 substrate
14 metal cap
16 quartz crystal resonator
17 quartz crystal blank
21 substrate body
22, 26, 40, 42, 44, 46, 97, 98 outer electrode
210, 212 electroconductive adhesive
300 quartz crystal oscillator

The invention claimed is:

1. A quartz crystal resonator unit comprising:
   a quartz crystal resonator that includes:
      an AT-cut quartz crystal blank that is plate-shaped and that is rectangular when viewed in a direction normal to a first main surface thereof; and
      a first outer electrode and a second outer electrode disposed on the first main surface of the AT-cut quartz crystal blank and arranged in a short-side direction in which short sides of the first main surface of the AT-cut quartz crystal blank extend;
   a plate-shaped substrate body having a second main surface; and
   a third outer electrode and a fourth outer electrode disposed on the second main surface of the substrate body, wherein the first outer electrode and the third outer electrode are fixed to each other via a first electroconductive adhesive, and the second outer electrode and the fourth outer electrode are fixed to each other via a second electroconductive adhesive,
   wherein long sides of the main surface of the AT-cut quartz crystal blank are substantially parallel to a Z' axis of the AT-cut quartz crystal blank,
   wherein the short sides of the main surface of the AT-cut quartz crystal blank are substantially parallel to an X axis of the AT-cut quartz crystal blank,
   wherein a frequency of a main vibration of the AT-cut quartz crystal blank is in a range of 20.0 MHz to 60.0 MHz, and
   wherein $0.050 \leq P \leq -0.0047 \times F + 1.728$, where P (mm) is a minimum distance between a first portion where the first electroconductive adhesive is in contact with the quartz crystal resonator and a second portion where the second electroconductive adhesive is in contact with the quartz crystal resonator in the short-side direction, and F (MHz) is the frequency of the main vibration of the AT-cut quartz crystal blank.

2. The quartz crystal resonator unit according to claim 1, wherein the frequency of the main vibration of the AT-cut quartz crystal blank is 37.4 MHz, and $0.370 \leq P \leq 0.683$.

3. The quartz crystal resonator unit according to claim 2, wherein a length of each of the long sides of the first main surface is 2.0 mm or smaller.

4. The quartz crystal resonator unit according to claim 3, wherein the first outer electrode is in contact with a first end of one of the short sides of the first main surface of the AT-cut quartz crystal blank, and
   wherein the second outer electrode is in contact with a second end of the one of the short sides of the main surface of the AT-cut quartz crystal blank.

5. The quartz crystal resonator unit according to claim 1, wherein a length of each of the long sides of the first main surface is 2.0 mm or smaller.

6. The quartz crystal resonator unit according to claim 5, wherein the first outer electrode is in contact with a first end of one of the short sides of the first main surface of the AT-cut quartz crystal blank, and
   wherein the second outer electrode is in contact with a second end of the one of the short sides of the main surface of the AT-cut quartz crystal blank.

7. The quartz crystal resonator unit according to claim 1, wherein a material of the substrate body is a ceramic.

8. The quartz crystal resonator unit according to claim 1, further comprising:
   a cap that disposed on the substrate body and covering the quartz crystal resonator.

9. The quartz crystal resonator unit according to claim 1, where a thickness of the AT-cut quartz crystal blank is in a range of 0.0278 mm to 0.0835 mm.

10. A quartz crystal resonator comprising:
an AT-cut quartz crystal blank that is plate-shaped and that is rectangular when viewed in a direction normal to a main surface thereof; and
a first outer electrode and a second outer electrode disposed on the main surface and arranged in a short-side direction in which short sides of the main surface extend,
wherein long sides of the main surface are substantially parallel to a Z' axis of the quartz crystal blank,
wherein the short sides of the main surface are substantially parallel to an X axis of the quartz crystal blank,
wherein a frequency of a main vibration of the quartz crystal blank is in a range of 20.0 MHz to 60.0 MHz, and
wherein $0.050 \leq P \leq -0.0047 \times F + 1.728$, where P (mm) is a distance between the first outer electrode and the second outer electrode in the short-side direction, and F (MHz) is the frequency of the main vibration of the quartz crystal blank.

11. The quartz crystal resonator unit according to claim 10, wherein the frequency of the main vibration of the AT-cut quartz crystal blank is 37.4 MHz, and $0.370 \leq P \leq 0.683$.

12. The quartz crystal resonator unit according to claim 11, wherein a length of each of the long sides of the first main surface is 2.0 mm or smaller.

13. The quartz crystal resonator unit according to claim 12,
wherein the first outer electrode is in contact with a first end of one of the short sides of the first main surface of the AT-cut quartz crystal blank, and
wherein the second outer electrode is in contact with a second end of the one of the short sides of the main surface of the AT-cut quartz crystal blank.

14. The quartz crystal resonator unit according to claim 10, wherein a length of each of the long sides of the first main surface is 2.0 mm or smaller.

15. The quartz crystal resonator unit according to claim 14,
wherein the first outer electrode is in contact with a first end of one of the short sides of the first main surface of the AT-cut quartz crystal blank, and
wherein the second outer electrode is in contact with a second end of the one of the short sides of the main surface of the AT-cut quartz crystal blank.

16. The quartz crystal resonator unit according to claim 10, where a thickness of the AT-cut quartz crystal blank is in a range of 0.0278 mm to 0.0835 mm.

* * * * *